(12) United States Patent
Pobanz

(10) Patent No.: US 6,664,842 B1
(45) Date of Patent: Dec. 16, 2003

(54) FET ACTIVE LOAD AND CURRENT SOURCE

(75) Inventor: Carl Walter Pobanz, Westlake Village, CA (US)

(73) Assignee: Inphi Corporation, Westlake Village, CA (US)

( * ) Notice: Subject to any disclaimer, the term of this patent is extended or adjusted under 35 U.S.C. 154(b) by 0 days.

(21) Appl. No.: 10/034,023

(22) Filed: Dec. 28, 2001

(51) Int. Cl.[7] ............................................. H03K 17/687
(52) U.S. Cl. ........................ 327/436; 327/89; 327/434
(58) Field of Search ............................ 327/427, 434, 327/436, 65, 89, 563

(56) References Cited

U.S. PATENT DOCUMENTS

| | | | | |
|---|---|---|---|---|
| 4,100,438 A | * | 7/1978 | Yokoyama | 327/581 |
| 4,317,055 A | * | 2/1982 | Yoshida et al. | 327/541 |
| 4,394,590 A | * | 7/1983 | Honda | 327/436 |
| 4,692,643 A | * | 9/1987 | Tokunaga et al. | 327/436 |
| 4,751,408 A | * | 6/1988 | Rambert | 327/436 |
| 6,380,793 B1 | * | 4/2002 | Bancal et al. | 327/427 |

* cited by examiner

*Primary Examiner*—Terry D. Cunningham
(74) *Attorney, Agent, or Firm*—Koppel, Jacobs, Patrick & Heybl

(57) ABSTRACT

The present invention is a circuit comprising two series-coupled field effect transistor (FET) devices with a resistor network coupled in parallel forming a composite device (that can be substituted directly for a single FET device). In applications such as active loads or current sources, the composite device exhibits a greater breakdown voltage and superior high-frequency characteristics. The resistor network provides optimum direct current (DC) bias for depletion mode devices and superior high-frequency loading. Bandwidth and stability are both increased. Furthermore, this circuit is compatible with depletion mode FET processes having a single fixed threshold voltage.

16 Claims, 12 Drawing Sheets

300

120

FET ACTIVE LOAD AND CURRENT SOURCE

BACKGROUND INFORMATION

1. Field of the Invention

The present invention relates to electronic circuits comprising field effect transistors (FET), and more specifically to composite transistors comprising a plurality of FET devices.

2. Description of Related Art

Field-effect transistors (FET) are today the fundamental building block for the majority of integrated electronic circuits. These circuits include, but are not restricted to, integrated circuits for fiber optic communications systems, such as amplifiers and high-speed analog and digital circuits. Various types of FETs are implemented in a number of semiconductor technologies including silicon (CMOS), Gallium Arsenide (GaAs) and Indium Phosphide (InP).

FETs are widely used as active loads and current sources in integrated circuits. These applications employ the saturation region of the nonlinear channel current-voltage relation in which FETs behave as voltage-controlled current sources. The current in the FET channel, between the drain and source nodes, is controlled by the voltage applied between the gate node and the source node. In the saturation region, the channel current is largely independent of the voltage applied across the channel—this results in high impedance presented to AC signals while allowing substantial DC current to pass. Applications include the insertion of DC bias current (a current source) as well as signal current-to-voltage conversion (an "active load") in amplifier circuits.

Applications such as fiber optic communications require circuits that operate near the speed limits of transistor technology. Fast FET devices like high electron mobility transistors (HEMT and PHEMT) fabricated in GaAs and InP, as well as silicon CMOS devices with ever smaller geometries, are being used in integrated circuits to meet these demands on switching speed and bandwidth. Traditional FET active load and current source circuits using high performance semiconductors become inadequate as the frequency of operation approaches the limits of the device.

FIG. 1a shows a stacked FET active load configuration 110. Two FETs W1 101 and W2 102 are coupled in series and each gate and source wired together. This circuit exhibits poor high frequency response due to the interaction between the impedances at the FET gate 103 and FET drain 104. In a high-frequency FET implementation, it may also exhibit negative resistance.

FIG. 1b shows a self-bootstrapped active load configuration 110. Two FETs 111 and 112 have their channels coupled in series, and both the gate 113 of FET 111 and the gate 114 of FET 112 are coupled to the source node 115 of FET 112. This circuit is not well suited to high-performance FET technologies, in which there is a single threshold voltage that is not variable by the circuit designer. This forces one FET device to operate near cutoff and the other in the triode region, with the result that the device periphery must be roughly twice that of the present invention to obtain the same DC current.

FIG. 1c is a cascode current source 120. Two FETs 121 and 122 are coupled with their channels in series, with bias voltages and AC ground presented to the gate terminals of both. This circuit is potentially unstable at high frequencies, and its overall stability is highly sensitive to the impedance presented to a gate 123 of FET 121, e.g. a small unavoidable inductance may lead to significant negative conductance at the output of the current source. Additionally, this circuit cannot be used as an active load with HEMT devices due to the lack of a P-type device.

Accordingly, there is a need for reliable high-performance active loads and current sources at higher frequencies.

SUMMARY OF THE INVENTION

The present invention is a circuit comprising two series-coupled field effect transistor (FET) devices with a resistor network coupled in parallel forming a composite device (that can be substituted directly for a single FET device). In applications such as active loads or current sources, the composite device exhibits a greater breakdown voltage and superior high-frequency characteristics. The resistor network provides optimum direct current (DC) bias for depletion mode devices and superior high-frequency impedance control. Bandwidth and stability are both increased. Furthermore, this circuit is compatible with depletion mode FET processes having a single fixed threshold voltage. Advantageously, the composite FET active load and current source in the present invention operates in an unconditionally stable state at all frequencies.

DETAILED DESCRIPTION

Figure 1A:
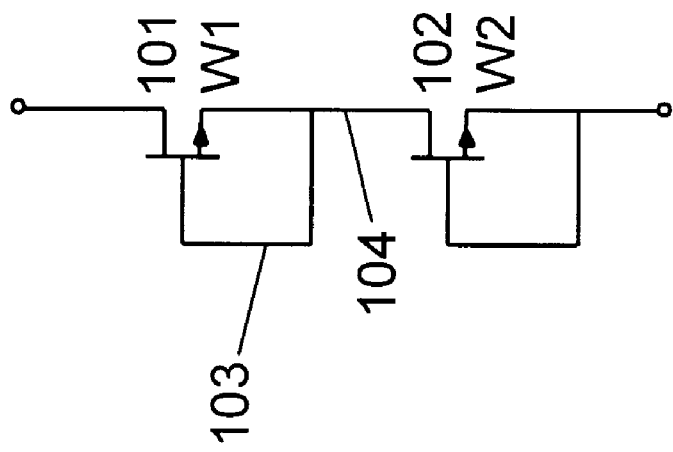
FIG. 1a is a prior art circuit diagram illustrating two series-connected field effect transistor devices in the stacked FET active load configuration.
Figure 1B:
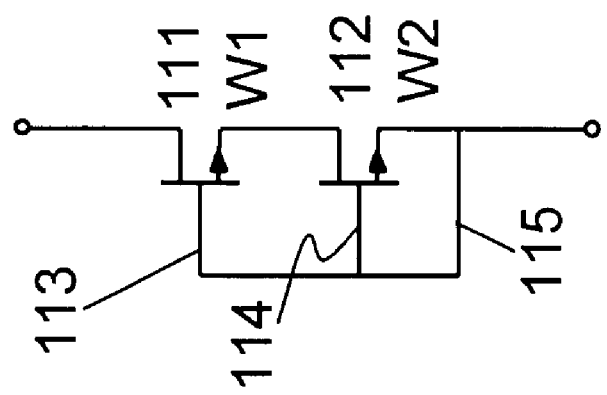
FIG. 1b is a prior art circuit diagram illustrating two series-connected field effect transistor devices in the self-bootstrapped active load configuration.
Figure 1C:
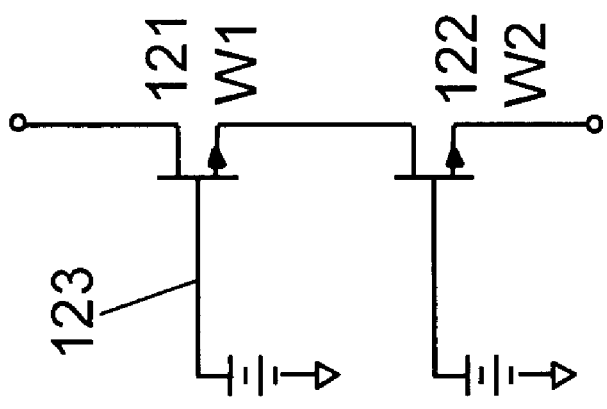
FIG. 1c is a prior art circuit diagram illustrating two series-connected field effect transistor devices in a cascode configuration.
Figure 2:
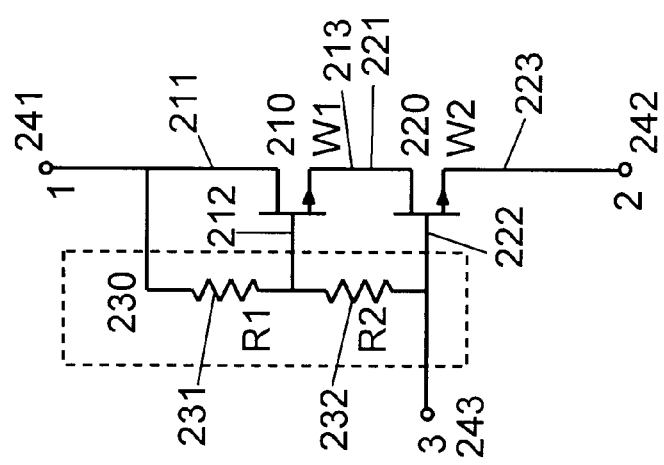
FIG. 2 is a circuit diagram illustrating a first embodiment of two series-connected field effect transistor devices with a resistive network in accordance with the present invention.

The general structure of the invention as shown in FIG. 2 is useful as a direct replacement for a single FET device. It exhibits higher impedance characteristics and voltage-handling capability than single FET devices, while exhibiting high-frequency stability that is critical for robust implementations in fast FET technologies.

FIG. 2 depicts a circuit diagram 200 illustrating a first embodiment of the present invention using field effect transistors (FETs) W1 210 and W2 220, coupled to a resistive network 230. The resistive network 230 includes a Resistor 231, having a top end and a bottom end, connected in series with a Resistor 232, having a top end and a bottom end. A gate 212 of FET 210 (W1) is coupled to the bottom end of Resistor R1 231 and the top end of Resistor R2 232. A drain terminal 211 of FET 210 is coupled to the top end of Resistor 231. A source terminal 213 of FET 210 is coupled to a drain 221 of FET 220 (W2). A gate 222 of FET 220 (W2) is coupled to the bottom end of Resistor 232 (R2). Resistors R1 231 and a resistor R2 232 form the resistive network that provides the proper dc bias voltages to the FET devices. This is the basic form of the invention, and while it may itself be used in circuits, variations on this topology compounds its usefulness in a variety of electronic applications.

One of ordinary skill in the art should recognize that transistor devices W1 210 and W2 220 are not limited to FETs as implemented in FIG. 2. The circuit can be similarly implemented with other transistor types, such as bipolar junction transistors.

Figure 3:
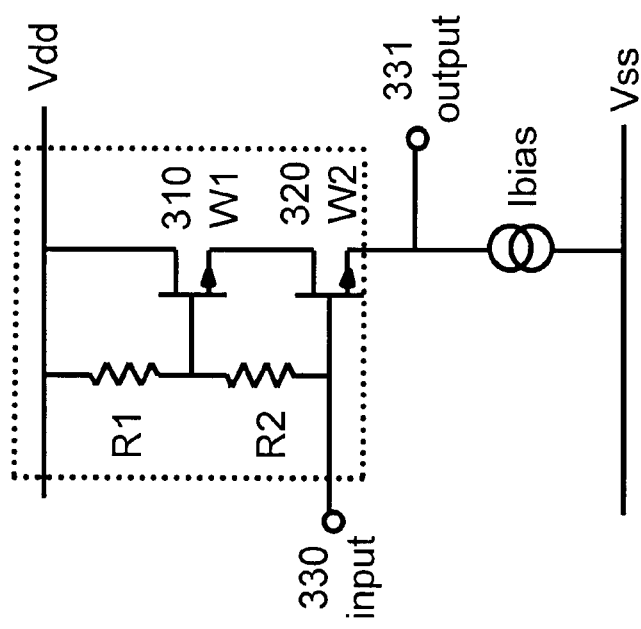
FIG. 3 is a circuit diagram illustrating a second embodiment of two series-connected field effect transistor devices with a resistive network used as a voltage follower in accordance with the present invention.

FIG. 3 shows a circuit diagram 300 illustrating a second embodiment of the present invention configured as a voltage follower using the general circuit topology as shown in FIG. 2. As in FIG. 2, FETs 310 and 320 are used as devices W1 and W2. In this instance, the invention directly replaces a single-FET voltage follower, and the resulting circuit achieves a higher output voltage and linear response range. The input signal is fed through input node 330 and a corresponding output voltage is received through output node 331. Because of the higher voltage range of the output, the circuit can also tolerate greater variations of the input voltage. Furthermore the gain of the device more closely approaches unity, i.e. the output accurately replicates the voltages of the input, resulting from reduced parasitic channel conductance as compared to a single FET.

Figure 4:
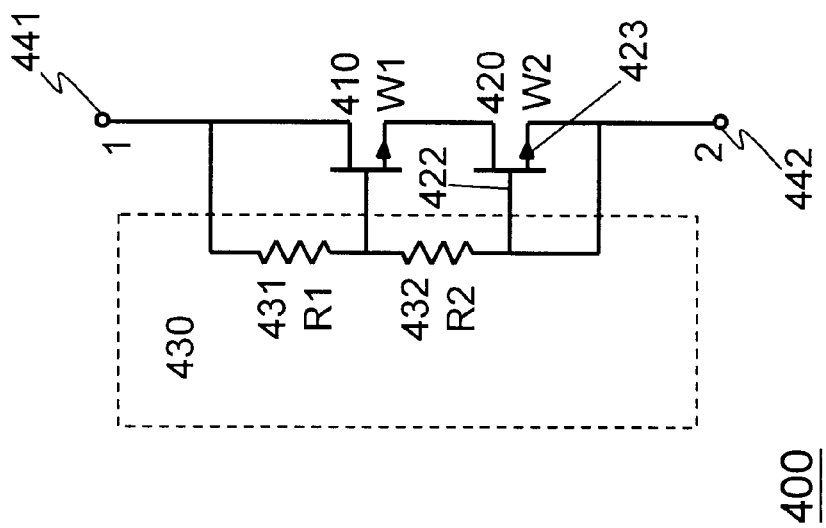
FIG. 4 is a circuit diagram illustrating a third embodiment of two series-connected field effect transistor devices with a resistive network in an active load/current source configuration in accordance with the present invention.

FIG. 4 shows a circuit diagram 400 illustrating a third embodiment of the present invention configured with a gate 422 and a source 423 of transistor 420 (W2) tied together. In such a configuration, the circuit acts as an active load or a current source.

The FET gate width 422 of Transistor W2 420 controls the DC current, which is equal to the Idss (current from drain to source with the gate shorted to the source) of W2 420. FET W1 410 in conjunction with resistors R1 431 and R2 432 operates as a current source in series with W2 420 to double the DC voltage range and as a voltage follower to signals at the source node 423 of W2 420 to reduce the signal voltage across W2 420 and thereby increase its output impedance. For the case of W1 410=W2 420 (sizes of transistors are equal resulting in equal performance characteristics) and R1 431=R2 432, half of the applied DC voltage is presented to the gate of W1 410, which forces the Vds (voltage between the drain and the source) across both transistors W1 410 and W2 420 to be equal while both devices conduct the full Idss current. This maximizes the voltage handling range and the DC current output of the active load. R1 431 and R2 432 also reduce the Q (quality factor) at the gate node of W1 410 to greatly stabilize the circuit at high frequencies while adding a real conductance across the input and output nodes of the circuit. This enables the use of large periphery FET devices and allows the circuit to function as a broadband RF load.

Figure 5A:
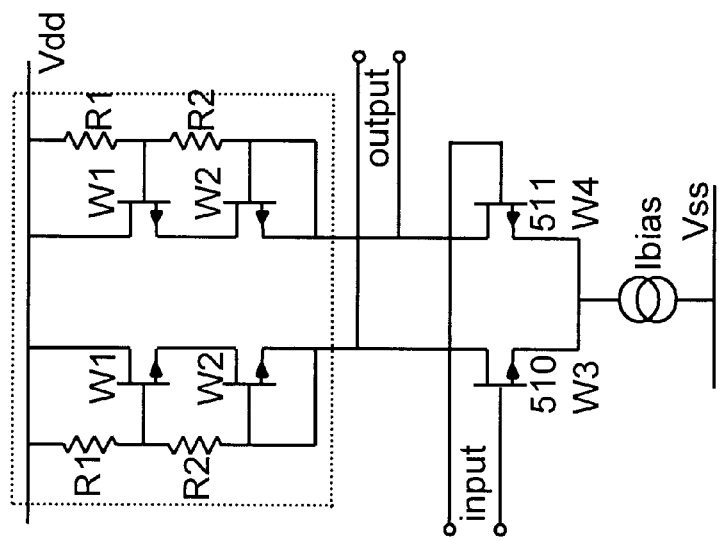
FIG. 5a is a circuit diagram illustrating the use of the present invention as an active load.
Figure 5B:
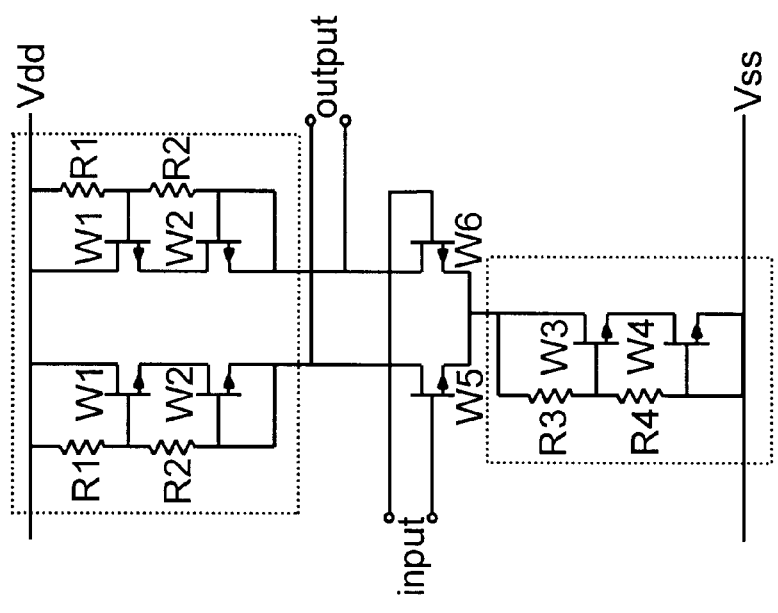
FIG. 5b is a circuit diagram illustrating the use of the present invention as an active load and current source.

FIG. 5a is a circuit diagram 500 illustrating the use of the present invention in a high-speed differential amplifier with the present invention serving as an active load for converting the signal current in the differential pair W3/W4 510/511 into an output voltage. FIG. 5b replaces the current source with the present invention providing a constant DC bias current to the amplifier. In both cases, the circuit performance exhibits many advantages. The range of the output voltage swing is higher due to the active load's high DC voltage range and linearity. For a given supply voltage, the differential amplifier provides higher current (increased headroom) and gain-bandwidth product. The circuit also exhibits flatter amplitude and group delay response over a larger bandwidth. At any frequency and over a high voltage range, the active load is unconditionally stable without oscillation or ringing effects. Finally, the reduced reactive component of the current source impedance contributes to common-mode stability at high frequencies.

Figure 6:
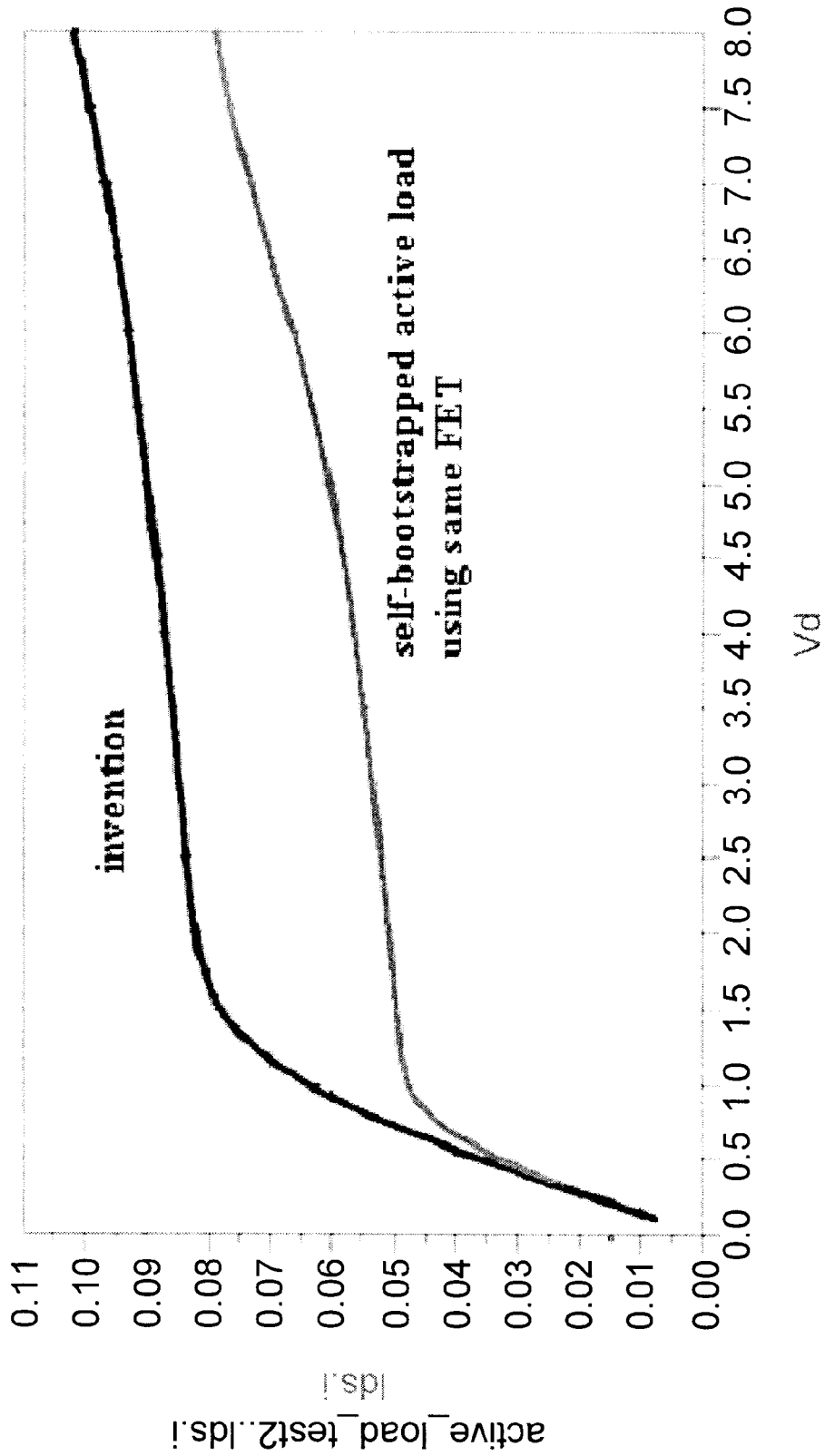
FIG. 6 is a graphical diagram illustrating DC i-v curve representations.
Figure 7A:
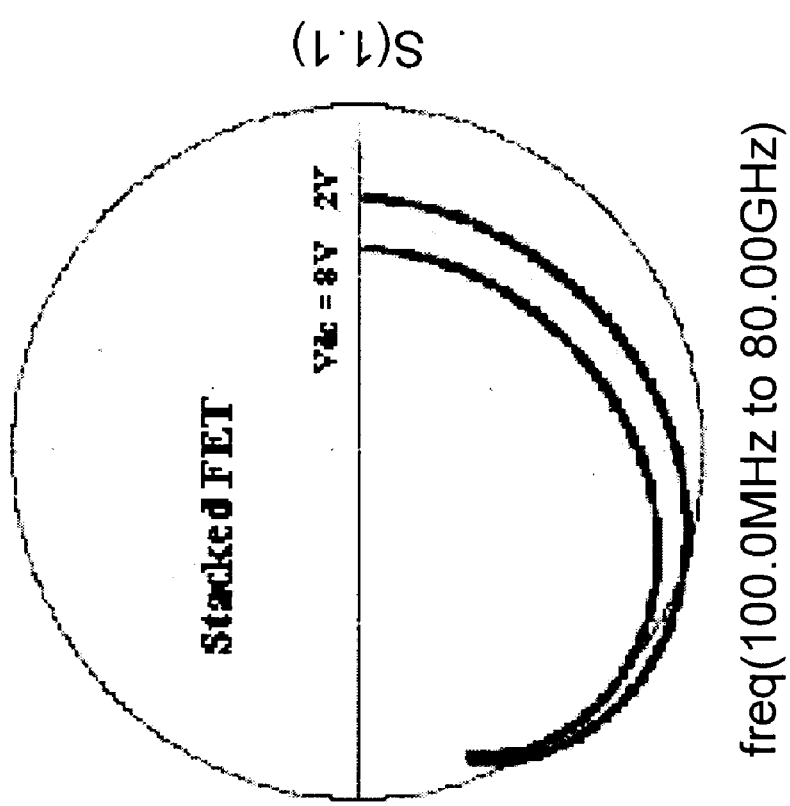
FIGS. 7a, 7b, and 7c are graphical diagrams illustrating, respectively, the comparison of broadband impedance of active load using identical FET devices between a stacked FET, a self-bootstrapped, and the present invention.
Figure 7B:
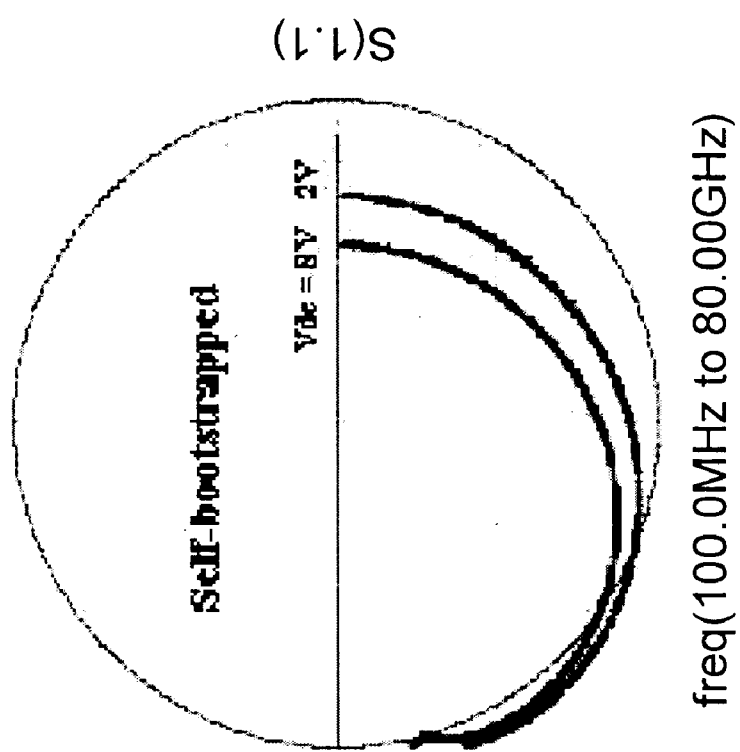
Figure 7C:
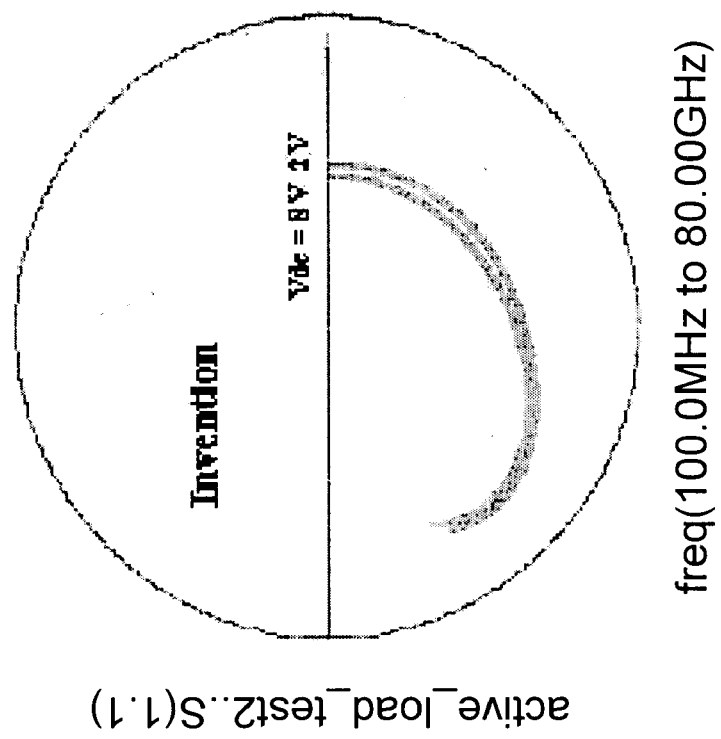

FIG. 6 is a graphical diagram illustrating DC i-v curve representations, showing increased current and linearity compared to the self-bootstrapped active load. FIGS. 7a, 7b, and 7c are graphical diagrams illustrating, respectively, the comparison of broadband impedance of active load using identical FET devices between a stacked FET, a self-bootstrapped, and the present invention. The present invention exhibits superior high-frequency impedance, stability, and dynamic range. The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

I claim:

1. A voltage follower circuit, comprising:
    a first field effect transistor (FET) having a source, a drain, and a gate, said drain connected to a first supply voltage;
    a second FET having a source, a drain, and a gate, the drain of the second FET connected to the source of the first FET, the gate of said second FET providing an input for said voltage follower circuit and the source of said second FET providing an output for said voltage follower circuit;
    a resistive network having a first resistor and a second resistor, each of which has first and second terminals, the first terminal of said first resistor connected to said first supply voltage, the second terminal of the first resistor coupled with the first terminal of the second resistor, the gate of the second FET coupled to the second terminal of the second resistor, and the gate of the first FET coupled to the second terminal of the first resistor; and
    a current source connected between the source of said second FET and a second supply voltage such that the voltage at said output follows a voltage applied at said input.

2. A field-effect transistor (FET) circuit suitable for use as an active load or current source, comprising:
    a first FET having its drain connected to a first terminal;
    a second FET having its drain connected to the source of said first FET, and its gate and source directly connected to a second terminal;
    a first resistor connected between said first terminal and the gate of said first FET; and
    a second resistor connected between the gate of said first FET and the gate of said second FET.

3. The FET circuit of claim 2, wherein the resistances of said first and second resistors are about equal such that a voltage applied across said first and second terminals is about equally distributed across said first and second FETs.

4. The FET circuit of claim 2, wherein the resistances of said first and second resistors are selected to stabilize the circuit over a desired range of frequencies for a voltage applied across said first and second terminals.

5. The FET circuit of claim 4, wherein said resistances are about equal.

6. The FET circuit of claim 4, wherein said resistances are unequal.

7. The FET circuit of claim 2, wherein the resistances of said first and second resistors are selected to tailor the circuit's impedance characteristics over a desired range of frequencies for a voltage applied across said first and second terminals.

8. The FET circuit of claim 2, further comprising a differential transistor pair, the output of one of said pair transistors connected to said FET circuit's second terminal and said FET circuit's first terminal connected to a supply voltage such that said FET circuit provides an active load for said pair transistor.

9. The FET circuit of claim 8, wherein the resistances of said first and second resistors are selected such that a desired load impedance is presented to said pair transistor over a desired range of RF frequencies.

10. The FET circuit of claim 2, further comprising first and second transistors arranged as a differential transistor pair, the outputs of said first and second pair transistors connected to first and second FET circuits, respectively, the output of said first pair transistor connected to the second terminal of said first FET circuit and the output of said second pair transistor connected to the second terminal of said second FET circuit, the first terminal of each of said FET circuits connected to a supply voltage such that said FET circuits provides active loads for said differential transistor pair.

11. The FET circuit of claim 2, further comprising a differential transistor pair, the current circuits of which are connected together at a common node, said common node connected to said FET circuit's first terminal and said FET circuit's second terminal connected to a supply voltage such that said FET circuit provides a bias current source for said differential transistor pair.

12. A differential amplifier with an active load, comprising:
a differential transistor pair comprising first and second transistors having their current circuits connected together at a common node;
a bias current source connected between said common node and a first supply voltage; and
an active load connected between a second supply voltage and the output of one of said pair transistors, said active load comprising:
a first field-effect transistor (FET) having its drain connected to a first terminal;
a second FET having its drain connected to the source of said first FET and its gate and source connected to a second terminal;
a first resistor connected between said first terminal and the gate of said first FET; and
a second resistor connected between the gate of said first FET and the gate of said second FET;
said first terminal connected to said second supply voltage and said second terminal connected to said pair transistor output.

13. The differential amplifier of claim 12, wherein the resistances of said first and second resistors are selected such that a desired load impedance is presented to said pair transistor over a desired range of RF frequencies.

14. The differential amplifier of claim 12, further comprising a second one of said active loads connected between said second supply voltage and the output of the other of said pair transistors.

15. The differential amplifier of claim 12, wherein said bias current source comprises:
a third field-effect transistor (FET) having its drain connected to a third terminal;
a fourth FET having its drain connected to the source of said third FET and its gate and source connected to a fourth terminal;
a third resistor connected between said third terminal and the gate of said third FET; and
a fourth resistor connected between the gate of said third FET and the gate of said fourth FET;
said third terminal connected to said common node and said fourth terminal connected to said first supply voltage.

16. A differential amplifier, comprising:
a differential transistor pair comprising first and second transistors having their current circuits connected together at a common node;
a bias current source connected between said common node and a supply voltage, said bias current source comprising:
a first field-effect transistor (FET) having its drain connected to a first terminal;
a second FET having its drain connected to the source of said first FET and its gate and source connected to a second terminal;
a first resistor connected between said first terminal and the gate of said first FET; and
a second resistor connected between the gate of said first FET and the gate of said second FET;
said first terminal connected to said common node and said second terminal connected to said supply voltage.

* * * * *